(12) United States Patent
Khaw et al.

(10) Patent No.: US 7,525,346 B2
(45) Date of Patent: Apr. 28, 2009

(54) DRIVER CIRCUITS AND METHODS

(75) Inventors: Michael P. Khaw, Portland, OR (US); Daniel S. Draper, Portland, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 774 days.

(21) Appl. No.: 10/193,834

(22) Filed: Jul. 11, 2002

(65) Prior Publication Data

US 2004/0008085 A1   Jan. 15, 2004

(51) Int. Cl.
    *H03F 3/45* (2006.01)
(52) U.S. Cl. .................... 327/52; 327/54; 330/252; 330/257
(58) Field of Classification Search .......... 330/252, 330/257, 260, 254; 327/52, 54, 55, 56, 65, 327/66, 563, 543, 108, 112, 81, 82, 83, 85, 327/87, 89; 314/150; 321/8 R; 326/81, 326/82, 83, 85, 87, 89
See application file for complete search history.

(56) References Cited

U.S. PATENT DOCUMENTS

| | | | | |
|---|---|---|---|---|
| 3,896,383 A * | 7/1975 | Bilotti et al. | ............. | 455/210 |
| 3,917,991 A * | 11/1975 | Ota et al. | ............. | 330/260 |
| 4,075,574 A * | 2/1978 | Gilbert | ............. | 330/257 |
| 4,166,982 A * | 9/1979 | Christopherson | ............. | 330/259 |
| 5,166,645 A * | 11/1992 | Watts | ............. | 331/37 |
| 5,530,444 A * | 6/1996 | Tice et al. | ............. | 341/156 |
| 5,682,121 A * | 10/1997 | Naokawa et al. | ............. | 330/252 |
| 5,691,567 A * | 11/1997 | Hirano et al. | ............. | 327/94 |
| 5,812,020 A * | 9/1998 | Raghavan et al. | ............. | 327/543 |
| 6,069,523 A * | 5/2000 | Brown | ............. | 327/563 |
| 6,111,463 A * | 8/2000 | Kimura | ............. | 330/254 |
| 6,344,762 B1 * | 2/2002 | Prentice | ............. | 327/65 |
| 6,535,534 B1 * | 3/2003 | Fischer | ............. | 372/38.07 |
| 6,559,718 B2 * | 5/2003 | Kudo et al. | ............. | 330/252 |

\* cited by examiner

*Primary Examiner*—Tuan T. Lam
*Assistant Examiner*—Hiep Nguyen
(74) *Attorney, Agent, or Firm*—Akin Gump Strauss Hauer & Feld LLP

(57) ABSTRACT

In one system embodiment, the system is characterized by: a differential amplifier including but not limited to at least one amplifying transistor having an emitter coupled directly to a ground. In one embodiment of a method of making a system, the method is characterized by: operably coupling at least one amplifying transistor of a differential amplifier directly to a ground. In one embodiment of a method of driving a system, the method is characterized by: driving at least one amplifying transistor of a differential amplifier with an emitter-follower feedback loop. In one system embodiment, the system is characterized by: a differential amplifier including but not limited to a first amplifying transistor having a base operably coupled with a first emitter-follower feedback loop.

16 Claims, 5 Drawing Sheets

DRIVER CIRCUITS AND METHODS

BACKGROUND OF THE APPLICATION

1. Field of the Application

The present application relates, in general, to electronic circuits which utilize amplifiers.

2. Description of the Related Art

With reference to the figures, and with reference now to FIG. 1A, shown is a schematic diagram of a classic differential amplifier circuit 100. Depicted is that for the classic differential amplifier circuit 100 shown, the gain, $G_{diff}$, of the differential amplifier 100 is equal to $V_{out}/(v_{input\_1}-v_{input\_2})$, or $R_C/2(R_E+r_e)$. Illustrated is that the common mode rejection ratio (CMRR) of the classic differential amplifier circuit 100 is approximately equal to $R_1/(R_E+r_e)$. See Horowitz and Hill, *The Art of Electronics* 98–99 (1989 2ed.).

Referring now to FIG. 1B, depicted is a schematic diagram of a modified version of the classic differential amplifier circuit 100 of FIG. 1A, wherein a current source 102 has been substituted for the resistor $R_1$. Those having ordinary skill in the art will appreciate that replacing the resistor $R_1$ with the current source 102 greatly reduces the common-mode gain relative to the differential amplifier circuit 100, and thereby greatly improves the CMRR relative to the classic differential amplifier circuit 100. Id at 100.

With reference now to FIG. 2, illustrated is a schematic diagram of an emitter-follower circuit 200, which is called an "emitter-follower" circuit because the output terminal, $V_{out}$, is the emitter, and hence follows the input (the base) less one diode drop (e.g., $V_E$ is approximately equal to $V_B$–0.6 volt). Hence the output voltage is a replica of the input (i.e., "follows" the input), except that output voltage is 0.6 to 0.7V less positive. For the circuit, $V_{in}$ ($V_{BE}$) must stay at +0.6 volt or more, or else the output will sit at ground. Those having ordinary skill in the art will appreciate that due to the fact that the emitter resistor $R_{EF}$ is coupled to a negative supply voltage, the emitter-follower circuit 200 will permit negative voltage swings as well. However, those skilled in the art will also appreciate that care must be taken with respect to the negative voltage swing, to ensure that the reverse bias break down voltage ($V_{BE}$) is not exceeded. Id at pages 65–68. In addition, those having ordinary skill in the art will also appreciate that care must also be taken with respect to the voltage across the collector and emitter so that BVces breakdown is not exceeded, and that comparatively low BVces break down voltage is a recognized problem of typical advanced high speed IC processes.

Referring now to FIG. 3, shown is a schematic diagram of transistors QC and QA connected in what is known in the art and as a "Darlington pair" 300. Those skilled in the art will appreciate that the Darlington pair 300 tends to act like a single transistor with a current gain equal to the product of the current gains of the two individual transistors. Depicted is a resistor 302 connected between the base and emitter of the second transistor QC driven by the first transistor QA, which those skilled in the art will appreciate improves the response time of the overall Darlington pair 300. Those skilled in the art will appreciate that for a Darlington pair without the resistor 302, the combination of transistors QC and QA tends to act like a rather slow transistor because QA cannot turn off QC quickly. Those skilled in the art will appreciate that this problem is usually taken care of by including the resistor 302 from base to emitter of QA, as shown in FIG. 3. The resistor 302 also prevents leakage current from QA from biasing QC into conduction; its value is chosen so that QA's leakage current (nanoamps for small-signal transistors; as much as hundreds of microamps for power transistors) produces less than a diode drop across resistor 302 and so that resistor 302 doesn't sink a large proportion of QC's base current when it has a diode drop across it. Typically resistor 302 might be a few hundred ohms in a power transistor Darlington, or a few thousand ohms for a small-signal Darlington. Id. at pages 95–98.

BRIEF SUMMARY OF THE APPLICATION

The inventors named herein have devised a device and related process which gives advantages over the foregoing described related art.

In one system embodiment, the system is characterized by: a differential amplifier including but not limited to at least one amplifying transistor having an emitter coupled directly to a ground. In another embodiment of the system, said at least one amplifying transistor having an emitter coupled directly to a ground is characterized by: a first amplifying transistor having a collector operably coupled with a source reference voltage; and a second amplifying transistor having a collector operably coupled with the source reference voltage. In another embodiment of the system, said first amplifying transistor having a collector operably coupled with a source reference voltage is characterized by: a third amplifying transistor having an emitter operably coupled to the collector of the first amplifying transistor and a collector operably coupled with the source reference voltage. In another embodiment of the system, said second amplifying transistor having a collector operably coupled with the source reference voltage is characterized by: a fourth amplifying transistor having an emitter operably coupled to the collector of the second amplifying transistor and a collector operably coupled with the source reference voltage. In another embodiment of the system, wherein said at least one amplifying transistor having an emitter coupled directly to a ground is characterized by: a first amplifying transistor having a base operably coupled with a first emitter-follower feedback loop; and a second amplifying transistor having a base operably coupled with a second emitter-follower feedback loop. In another embodiment of the system, said first amplifying transistor having a base operably coupled with a first emitter-follower feedback loop is characterized by the first emitter-follower feedback loop including but not limited to (a) a first driver transistor having an emitter operably coupled to a base of a first feedback transistor and a base of the first amplifying transistor, (b) a resistor operably coupled between the base of the first feedback transistor and the ground, and (c) the collector of the first feedback transistor operably coupled with a base of the first driver transistor. In another embodiment of the system, said first driver transistor having an emitter operably coupled to a base of a first feedback transistor and a base of the first amplifying transistor is characterized by: a second driver transistor operably coupled with the first driver transistor and an input voltage. In another embodiment of the system, said second amplifying transistor having a base operably coupled with a second emitter-follower feedback loop is characterized by the second emitter-follower feedback loop including but not limited to (a) a first driver transistor having an emitter operably coupled to a base of a first feedback transistor and a base of the second amplifying transistor, (b) a resistor operably coupled between the base of the first feedback transistor and the ground, and (c) the collector of the first feedback transistor operably coupled with a base of the first driver transistor. In another embodiment of the system, said first driver transistor having an emitter operably coupled to a base of a first feedback transistor and a base of the second amplifying transistor is characterized by: a second driver transistor operably coupled with the first driver transistor and an input voltage. In another embodiment of the system, the system is characterized by: Electroabsorption Modulator or Direct Modulated Laser or Mach-Zehnder Modulator circuitry operably coupled with said differential amplifier. In another embodiment of the system, the system is characterized by: a fiber optic transmission system having circuitry operably coupled with said differential amplifier.

In one embodiment of a method of making a system, the method is characterized by: operably coupling at least one amplifying transistor of a differential amplifier directly to a ground. In another embodiment of the method of making a system, said operably coupling at least one amplifying transistor of a differential amplifier directly to a ground is characterized by: operably coupling a collector of a first amplifying transistor with a source reference voltage; and operably coupling a collector of a second amplifying transistor with the source reference voltage. In another embodiment of the method of making a system, said operably coupling at least one amplifying transistor of a differential amplifier directly to a ground is characterized by: operably coupling a base of a first amplifying transistor with a first emitter-follower feedback loop; and operably coupling a base of a second amplifying transistor with a second emitter-follower feedback loop. In another embodiment of the method of making a system, said operably coupling a base of a first amplifying transistor with a first emitter-follower feedback loop is characterized by: operably coupling an emitter of a first driver transistor with a base of a first feedback transistor and the base of the first amplifying transistor, operably coupling a resistor between the base of the first feedback transistor and the ground, and operably coupling a collector of the first feedback transistor with a base of the first driver transistor. In another embodiment of the method of making a system, said operably coupling a base of a first amplifying transistor with a first emitter-follower feedback loop is characterized by: operably coupling a second driver transistor with a first driver transistor and an input voltage. In another embodiment of the method of making a system, said operably coupling a base of a second amplifying transistor with a second emitter-follower feedback loop is characterized by: operably coupling an emitter of a first driver transistor with a base of a first feedback transistor and the base of the second amplifying transistor, operably coupling a resistor between the base of the first feedback transistor and the ground, and operably coupling a collector of the first feedback transistor with a base of the first driver transistor. In another embodiment of the method of making a system, said operably coupling a base of a second amplifying transistor with a second emitter-follower feedback loop is characterized by: operably coupling a second driver transistor with a first driver transistor and an input voltage. In another embodiment of the method of making a system, said operably coupling at least one amplifying transistor of a differential amplifier directly to a ground is characterized by: operably coupling Electroabsorption Modulator or Direct Modulated Laser or Mach-Zehnder Modulator circuitry with said differential amplifier. In another embodiment of the method of making a system, said operably coupling at least one amplifying transistor of a differential amplifier directly to a ground is characterized by: operably coupling fiber optic transmission system circuitry with said differential amplifier.

In one embodiment of a method of driving a system, the method is characterized by: driving at least one amplifying transistor of a differential amplifier with an emitter-follower feedback loop. In another embodiment of the method of driving a system, said driving at least one amplifying transistor of a differential amplifier with an emitter-follower feedback loop is characterized by: driving a base of the at least one amplifying transistor with an emitter of a first driving transistor; and controlling the first driving transistor with a collector of a first feedback transistor having a base operably coupled with the emitter of the first driving transistor. In another embodiment of the method of driving a system, said driving at least one amplifying transistor of a differential amplifier with an emitter-follower feedback loop is characterized by: sinking current from an emitter of the at least one amplifying transistor to a ground. In another embodiment of the method of driving a system, said driving at least one amplifying transistor of a differential amplifier with an emitter-follower feedback loop is characterized by: activating Electroabsorption Modulator or Direct Modulated Laser or Mach-Zehnder Modulator circuitry via said driving at least one amplifying transistor of a differential amplifier with an emitter-follower feedback loop. In another embodiment of the method of driving a system, said driving at least one amplifying transistor of a differential amplifier with an emitter-follower feedback loop is characterized by: activating a fiber optic transmission system via said driving at least one amplifying transistor of a differential amplifier with an emitter-follower feedback loop.

In one system embodiment, the system is characterized by: a differential amplifier including but not limited to a first amplifying transistor having a base operably coupled with a first emitter-follower feedback loop. In another embodiment of the system, said first amplifying transistor having a base operably coupled with a first emitter-follower feedback loop is characterized by: the first emitter-follower feedback loop including but not limited to (a) a first driver transistor having an emitter operably coupled to a base of a first feedback transistor and the base of the first amplifying transistor, (b) a resistor operably coupled between the base of the first feedback transistor and the ground, and (c) the collector of the first feedback transistor operably coupled with a base of the first driver transistor.

In one embodiment, a method of modulating a signal comprises: providing an input current to a current input of an amplifier; conducting a first current through a first input stage of the amplifier; conducting a second current substantially equal to a difference between the input current and the first current through a second input stage of the amplifier; conducting a third current through a first transistor coupled between the first input stage and a first output; and conducting a fourth current through a second transistor coupled between the second input stage and a second output.

In one embodiment, a modulator has a driver, the driver comprising: a first input stage comprising: a first transistor coupled between a first node and a second node and having a control terminal coupled to a third node; a second transistor coupled between a fourth node and the second node and having a control terminal coupled to the third node; a third transistor coupled between a fifth node and the third node and having a control terminal coupled to the fourth node; and a first resistor coupled between the third node and the second node; a second input stage comprising: a fourth transistor coupled between a sixth node and the second node and having a control terminal coupled to a seventh node; a fifth transistor coupled between an eighth node and the second node and having a control terminal coupled to the seventh node; a sixth transistor coupled between a ninth node and the seventh node and having a control terminal coupled to the eighth node; and a second resistor coupled between the seventh node and the second node; and an output stage comprising: a seventh transistor coupled between the first node and a tenth node and having a control terminal coupled to an eleventh node; and an eighth transistor coupled between the sixth node and a twelfth node and having a control terminal coupled to the eleventh node.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE SEVERAL VIEWS OF THE DRAWING(S)

Figure 5:
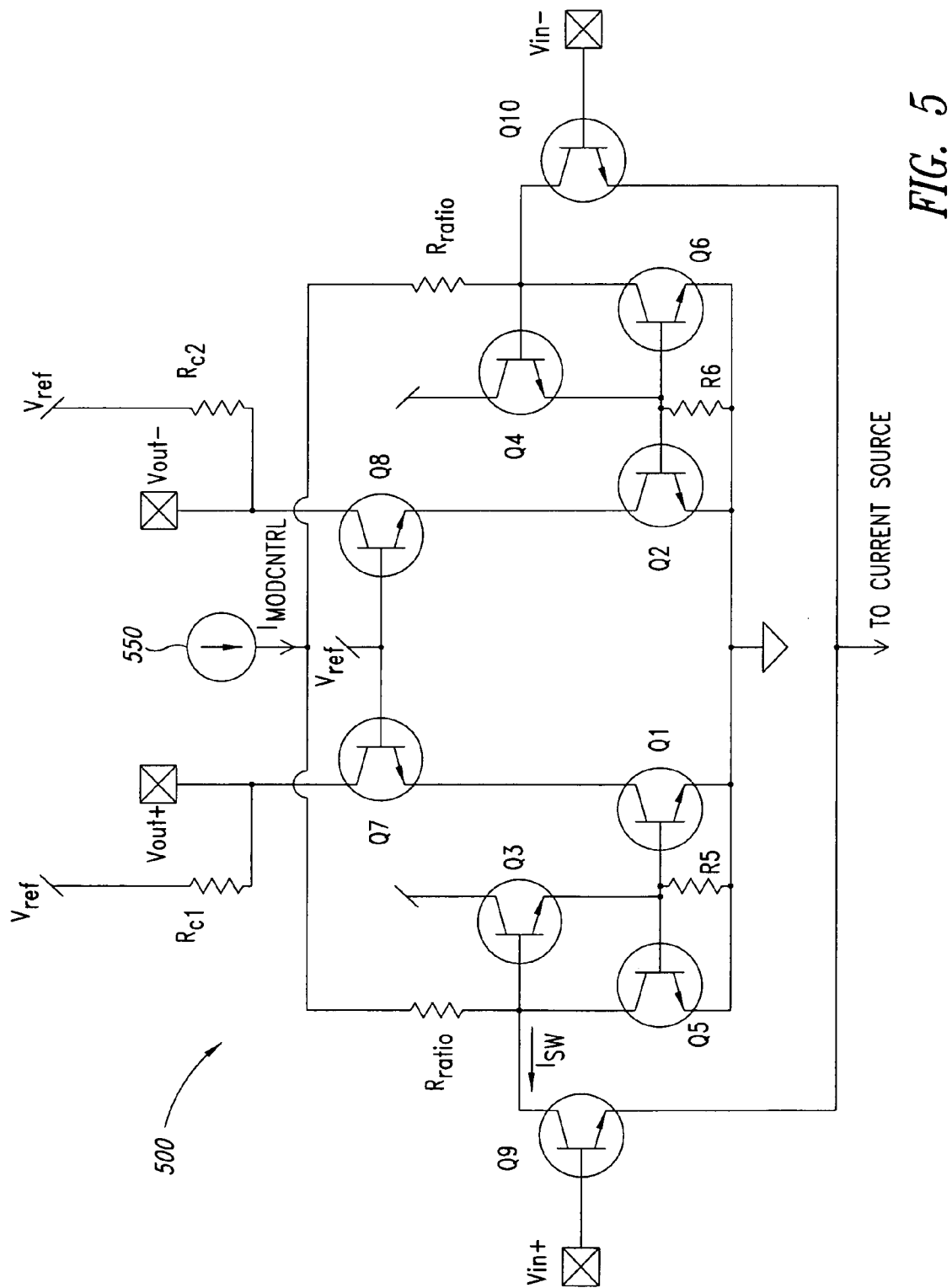

FIG. 5, shown is a schematic diagram of low headroom, high output swing EAM/DML/MZM driver circuit 500.

Figure 6:
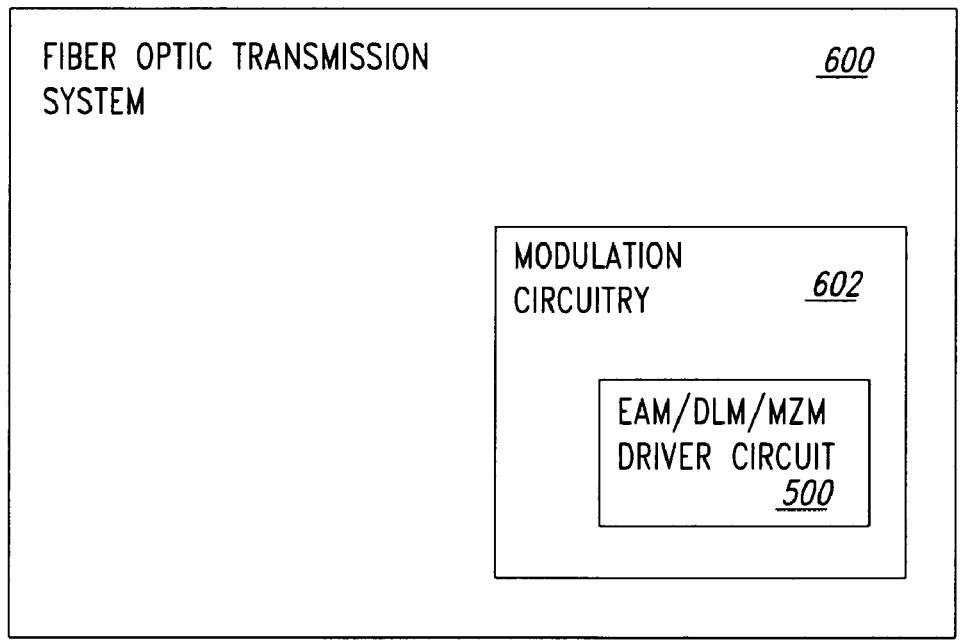

FIG. 6 shows an example representation of a fiber optic transmission system into which at least a part of the herein described devices and/or processes may be integrated with a reasonable amount of experimentation.

The use of the same symbols in different drawings typically indicates similar or identical items.

DETAILED DESCRIPTION OF THE APPLICATION

Figure 1A:
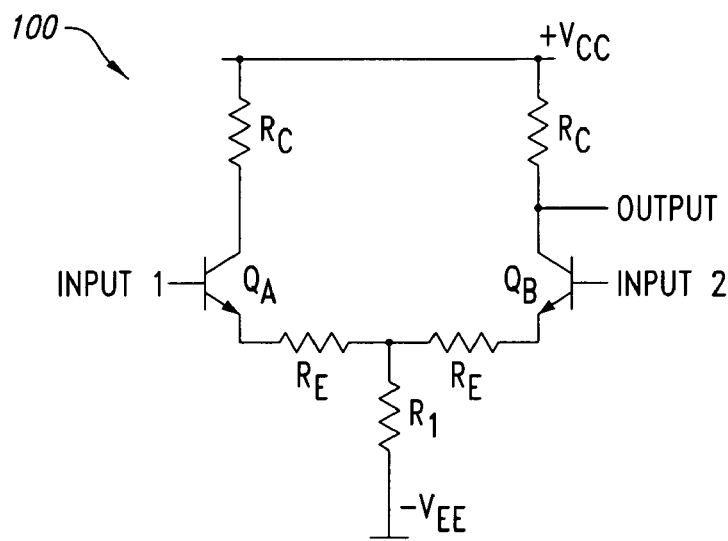
FIG. 1A shows a schematic diagram of a classic differential amplifier circuit 100.
Figure 1B:
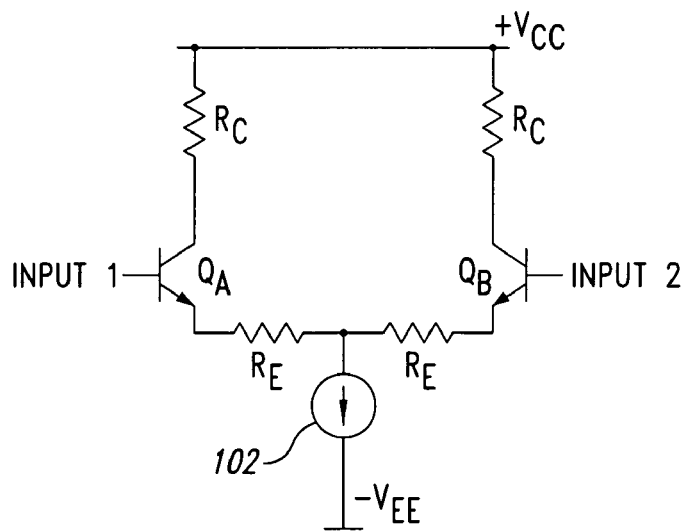
FIG. 1B depicts a schematic diagram of a modified version of the classic differential amplifier circuit 100 of FIG. 1A, wherein a current source 102 has been substituted for $R_1$.
Figure 2:
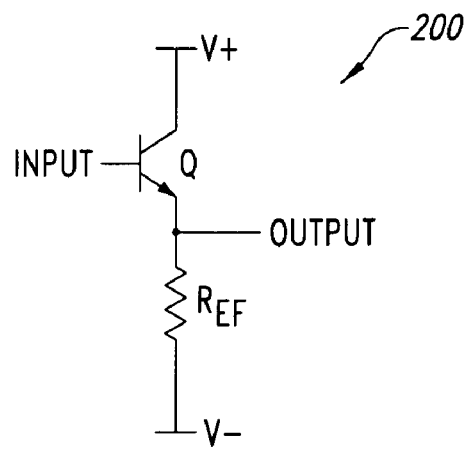
FIG. 2 illustrates a schematic diagram of an emitter-follower circuit 200, which is called an "emitter-follower" circuit because the output terminal, $V_{out}$, is the emitter, and hence follows the input (the base) less one diode drop (e.g., $V_E$ is approximately equal to $V_B$–0.6 volt).
Figure 3:
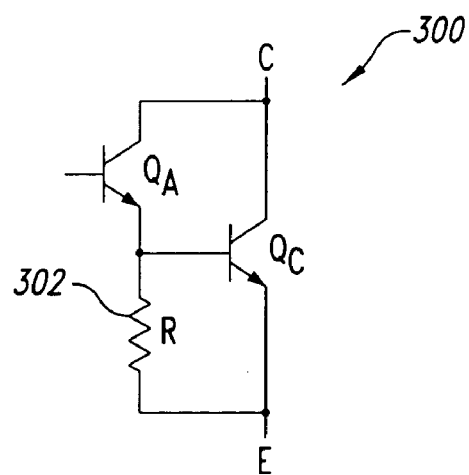
FIG. 3 shows a schematic diagram of transistors QC and QA connected in what is known in the art and as a "Darlington pair" 300.
Figure 4:
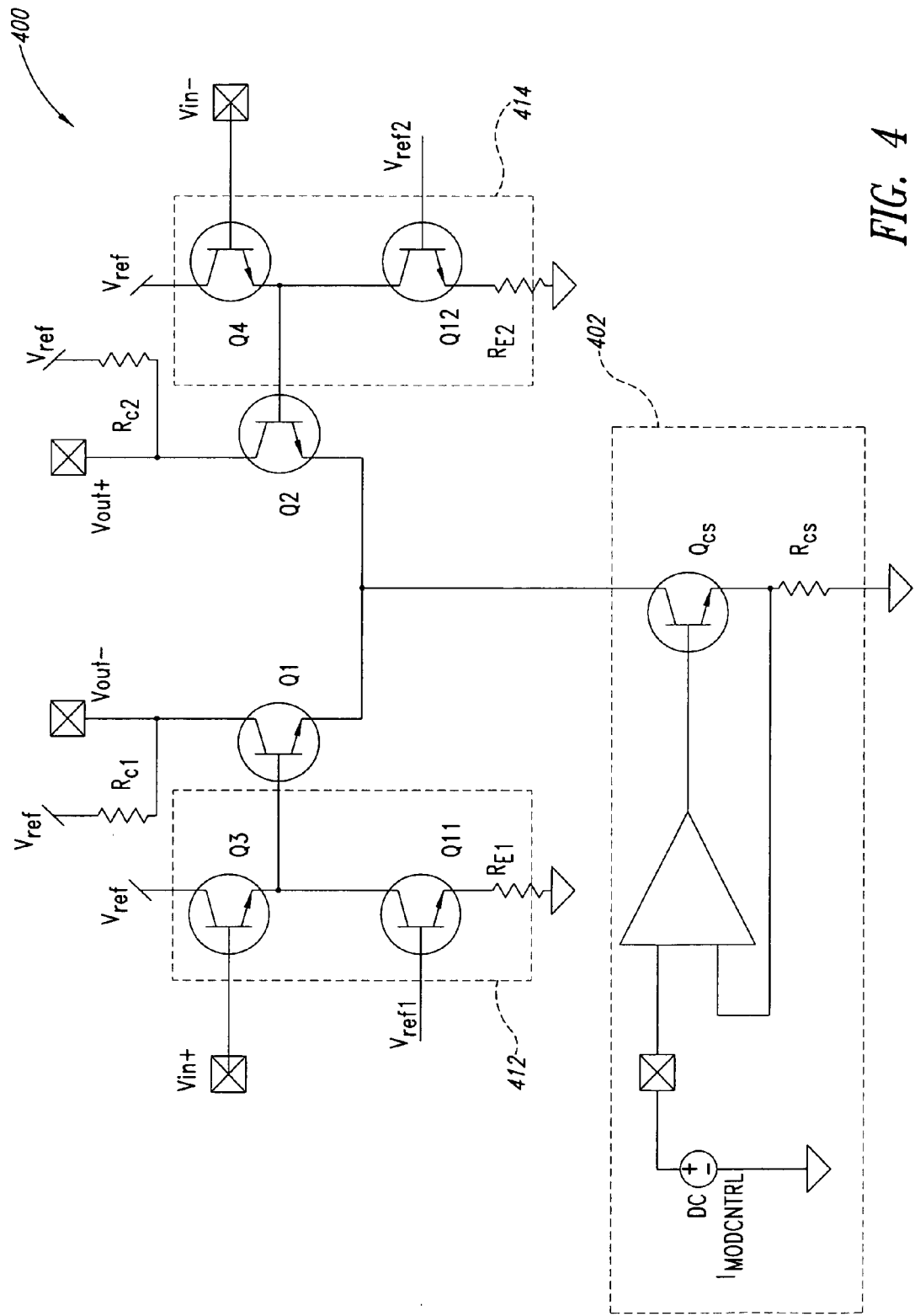
FIG. 4, depicts a schematic diagram of what is known in the art as an Electroabsorption Modulator/Direct Modulated Laser/Mach-Zehnder Modulator (EAM/DML/MZM) driver circuit 400.

With reference now to FIG. 4, depicted is a schematic diagram of what is known in the art as an Electroabsorption Modulator/Direct Modulated Laser/Mach-Zehnder Modulator (EAM/DML/MZM) driver circuit 400. Comparison of EAM/DML/MZM driver circuit 400 with the circuits shown and described in relation to FIGS. 1–3 reveals that EAM/DML/MZM driver circuit 400 can be viewed as a modified composite of the earlier described circuits. Specifically illustrated is a circuit analogous to the differential amplifier circuit 100 of FIG. 1B (composed of transistors Q1 and Q2, resistors $R_{C1}$ and $R_{C2}$, and current source 402). However, shown is that, rather than Vin+ and Vin– driving the differential amplifier-like circuit directly, as was shown in FIG. 1B, instead Vin+ and Vin– are each respectively driving the differential amplifier-like circuit through circuitry which functions somewhat analogously to a combination of the emitter-follower circuit 200 of FIG. 2 and the Darlington pair 300 of FIG. 3.

Depicted is that the bases of transistors Q1 and Q2 are respectively driven by emitter-follower-like circuits 412 and 414. Illustrated is that transistor Q1 is driven by the emitter-follower-like circuit 412, composed of transistors Q3 and Q11, resistor $R_{E1}$ and voltage Vref1, where transistor Q11, Resistor $R_{E1}$ and voltage $V_{ref1}$ now appear in the position previously occupied by resistor $R_{EF}$ in the emitter-follow circuit 200 of FIG. 2. Those skilled in the art will recognize that reference voltage $V_{ref1}$ and resistor $R_{E1}$ are chosen such that, in the aggregate, transistor Q11 functions to draw current into its collector sufficient to provide biasing current to transistor Q3 such that transistor Q3 and Q1 can operate as well or better than transistors QA and QC do in the circuit shown and described in relation to FIG. 3. That is, in addition to the foregoing described functions, reference voltage $V_{ref1}$, resistor $R_{E1}$, and transistor Q11 perform a function analogous to that described for the resistor appearing in the Darlington pair 300 of FIG. 3. Those having ordinary skill in the art will appreciate that, due to the symmetry of the circuitry components, emitter-follower-like circuit 414 functions in a substantially similar fashion to that described for emitter-follower-like circuit 412.

Referring now to FIG. 5, shown is a schematic diagram of a low headroom, high output swing EAM/DML/MZM driver circuit 500. In one embodiment, when Vin+ goes high, Vin– goes low. When Vin+ goes high, transistor Q9 turns on which takes the base of transistor Q3 to approximately ground voltage, which causes transistor Q3 to turn off. When transistor Q3 to turns off, it no longer supplies current across resistor R5, and thus the voltage at the bases of transistor Q5 and Q1 goes low, which turns off transistors Q5 and Q1. When Q1 shuts off, substantially no current can flow from the emitter of transistor of Q7 to ground, and thus the output Vout+ is pulled high.

As noted, in one embodiment, when Vin+ goes high, Vin– goes low. When Vin– goes low, transistor Q10 turns off which in turn causes the base of transistor Q4 to go to high, which causes transistor Q4 to turn on. When transistor Q4 turns on, current flows across resistor R6, which causes the bases of transistors Q2 and Q6 to go high. When the base of transistor Q2 goes high, Q2 turns on, which in turn allows current to flow through the collector of transistor Q8. When current flows through the collector of transistor Q8, the output Vout– is pulled low.

As noted, at this point current will be flowing through transistor Q6. Those skilled in the art will appreciate that for the circuitry shown, such current flowing through transistor Q6 will have magnitude approximately equal to (Imodcntrl–Isw), where Imodcntrl refers to the current sourced by modulation current source 550 and Isw refers to the switched current, which in one embodiment is roughly the current in transistor Q9 when Vin+ is high, Vin– is low.

Insofar as the voltage values at the bases of transistors Q2 and Q6 will be the same (e.g., the voltage developed across resistor R6), those having ordinary skill in the art will appreciate that if the physical device areas of transistors Q2 and Q6 are roughly the same, then the current flowing in transistor Q2 will be roughly the same (i.e., roughly Imodcntrl–Isw).

Continuing with the present example, (i.e., with Vin+ high and Vin– low assumed), as noted above, since there is substantially no current flowing through Q7, Vout+ is pulled high. While from a theoretical standpoint this state of affairs seems satisfactory, in practice the inventors have discovered that it is preferable to keep a some small amount of current flowing in Q7, even when Q7 is technically "OFF," so that Q7 can turn back on quickly during high speed switching; this small amount of current can be referred to as "OFF" current.

In one embodiment, this small amount of current is ensured by selecting resistors, having resistances $R_{ratio}$, of magnitudes sufficient to provide an adequate "ON/OFF" current ratio between Q7 and Q8. This is the ratio of "ON" current in Q8 to "OFF" current in Q7. For example $R_{ratio}$ resistance resistors will set the voltage difference between the base of Q4 and Q3 which will in turn set the desired "ON/OFF" ratio between Q7 and Q8.

Continuing with the present example (with Vin+ high and Vin− low), the inventors have found the following heuristic to be useful in selecting $R_{ratio}$ resistance magnitudes:

$$V_{base\_of\_Q4} - V_{base\_of\_Q3} = Rratio*(Imodcntrl-Isw) - Rratio*(Isw), \text{ or}$$

$$V_{base\_of\_Q4} - V_{base\_of\_Q3} = Ratio*(Imodcntrl - 2*Isw).$$

Using the foregoing heuristic, the inventors have been able to choose the appropriate resistance values, Rratio, such that an adequate "ON/OFF" current ratio between Q7 and Q8 will be maintained. Those skilled in the art will recognize that exactly what that ratio is will depend upon the characteristics of the actual transistors utilized and thus is best determined empirically.

Those skilled in the art will appreciate that the circuit of FIG. 5 is substantially symmetrical, so when Vin+ goes low, and Vin− goes high, the circuit will essentially operate in the reverse fashion from that just described.

Thus, when Vin+ goes high and Vin− goes low, the current in Q6 is approximately equal to Imodcntrl minus the current in Q9. Similarly, when Vin+ goes low and Vin− goes high, the current in Q5 is approximately equal to Imodcntrl minus the current in Q10.

The foregoing described circuitry has a number of advantages over the related art. For instance, in contrast with the system of FIG. 4, notice that in the circuitry of FIG. 5 transistor Q1 is driven by the combination of Q9, Q3, and Q5, rather than the emitter-follower-like circuitry 412. As those having ordinary skill in the art will appreciate, in the emitter-follower-like circuitry of FIG. 4, transistors Q3 and Q11 typically work to maintain a standing bias current of, for example, approximately 20 milliamps, so that Q3 can quickly turn on transistor Q1 when the need arises. In contrast, in the circuitry shown in FIG. 5, when Q3 is turned on, the emitter-follower-like structure of Q3 is connected to the base of transistor Q5, which ensures that the collector Q5 will sink current whenever Q3 is active. Hence, those skilled in the art will appreciate that Q9 can cause Q3 to shut off in a very quick fashion because Q5 sinks current when Q3 is active.

Note that when Q3 shuts off, Q1 can also rapidly shut off in that the structure formed by Q3 and Q1 functions substantially analogously to the Darlington pair 300 as described in relation to FIG. 3. Consequently, those having ordinary skill in the art will appreciate that the structure shown in FIG. 5 provides for the rapid shutoff of transistor Q1 such as that provided by Q11 and its associated resistor 406 of FIG. 4, except that in the circuitry of FIG. 5, when Q3 is inactive, Q5 will be inactive also, thus avoiding the 20 milliamp standing bias current of the related art circuit of FIG. 4. Those having ordinary skill in the art will appreciate that this lack of standing bias current constitutes a significant advantage.

Those skilled in the art will also appreciate that another advantage that the circuitry of FIG. 5 has over the system of FIG. 4 is that the emitters of transistors Q1 and Q2 are connected directly to ground. One advantage of such direct-to-ground emitter connections is that such connections decrease the amount of headroom necessary to run the circuitry of the differential amplifier circuitry 500. Referring back to the circuitry of FIG. 4, note that since the emitters of Q1 and Q2 are connected through $Q_{CS}$ and it's associated resistor Rcs to ground, the reference sources (e.g., Vcc) must have a bit of extra voltage to overcome the resistance of $Q_{CS}$ and Rcs—this bit of extra voltage is known in the art as headroom. Notice that in the circuitry shown in FIG. 5, since the emitters of Q1 and Q2 are connected directly to ground, there is no need for the reference voltage sources to supply this headroom. Those skilled in the art will recognize that this is a significant advantage, and can often give a headroom savings of up to 1 V; the foregoing is particularly true when certain of the advantages of the circuitry of FIG. 5 (e.g., the reduction of the Miller effect) are pursued via the addition of a cascade stage to the circuitry of FIG. 4.

Those skilled in the art will also appreciate that yet another advantage that the circuitry of FIG. 5 has is that without the cascade stage of Q7 and Q8 of FIG. 5, the voltage across the collector and emitter of Q1 can exceed the BVces breakdown voltage when Vout+ is pulled high, which is a problem that does not tend to arise in the circuitry of FIG. 5. In addition, those skilled in the art will appreciate that similar problems for Q2 exist when Vout− goes high without the cascade stage shown.

Those skilled in the art will recognize that it is common within the art to describe devices and/or processes in the fashion set forth herein, and thereafter use standard engineering practices to integrate such described devices and/or processes into data processing systems. That is, the devices and/or processes described herein can be integrated into a fiber optic transmission system via a reasonable amount of experimentation. FIG. 6 shows an example representation of a fiber optic transmission system into which at least a part of the herein described devices and/or processes may be integrated with a reasonable amount of experimentation.

With reference now to FIG. 6, depicted is a pictorial representation of a fiber optic transmission system 600 (e.g., an optical bridge, router, regenerator, etc.) in which portions of the illustrative embodiments of the devices and/or processes described herein may be implemented. Depicted is fiber optic transmission system 600 which includes modulator circuitry 602 (e.g., Electroabsorption Modulator or Direct Modulated Laser or Mach-Zehnder Modulator circuitry). Illustrated is that modulator circuitry 602 includes EAM/DML/MZM driver circuit 500.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. For example, those having ordinary skill in the art will appreciate that while the description herein has utilized n-p-n transistors for sake of illustration, such n-p-n transistors can be replaced with various types of Field Effect Transistors (FETs), such as n-type FETs or Metal Oxide Semiconductor (MOS) FETs with a minimum amount of experimentation well within the ambit of one having ordinary skill in the art.

Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A driver circuit, comprising:
   a first input stage comprising:
      a first transistor coupled between a first node and a second node and having a control terminal coupled to a third node;
      a second transistor coupled between a fourth node and the second node and having a control terminal coupled to the third node;
      a third transistor coupled between a fifth node and the third node and having a control terminal coupled to the fourth node; and
      a first resistor coupled between the third node and the second node;
   a second input stage comprising:
      a fourth transistor coupled between a sixth node and the second node and having a control terminal coupled to a seventh node;
      a fifth transistor coupled between an eighth node and the second node and having a control terminal coupled to the seventh node;
      a sixth transistor coupled between a ninth node and the seventh node and having a control terminal coupled to the eighth node; and
      a second resistor coupled between the seventh node and the second node; and
   an output stage comprising:
      a seventh transistor coupled between the first node and a tenth node and having a control terminal coupled to an eleventh node; and
      an eighth transistor coupled between the sixth node and a twelfth node and having a control terminal coupled to the eleventh node.

2. The driver circuit of claim 1, further comprising:
   a third resistor coupled between the tenth node and a thirteenth node; and
   a fourth resistor coupled between the twelfth node and a fourteenth node.

3. The driver circuit of claim 2 wherein the second node is a ground node.

4. The driver circuit of claim 1 wherein the first transistor is an NPN transistor.

5. The driver circuit of claim 3 wherein the fifth node, the ninth node, the eleventh node, the thirteenth node and the fourteenth node are coupled to a reference voltage.

6. The driver circuit of claim 2, further comprising:
   a ninth transistor coupled between the fourth node and a fifteenth node and having a control terminal;
   a tenth transistor coupled between the eighth node and the fifteenth node and having a control terminal;
   a fifth resistor coupled between the fourth node and a sixteenth node; and
   a sixth resistor coupled between the eighth node and the sixteenth node.

7. The driver circuit of claim 6, further comprising:
   a first current source coupled to the fifteenth node; and
   a second current source coupled to the sixteenth node.

8. The driver circuit of claim 7 wherein the second current source is configured to produce a modulating current.

9. The driver circuit of claim 6 wherein the second node is coupled to a ground.

10. The driver circuit of claim 9 wherein the fifth node, the ninth node, the eleventh node, the thirteenth node and the fourteenth node are coupled to a reference voltage.

11. A driver circuit, comprising:
    a first input stage comprising:
       a first transistor coupled between a first node and a second node and having a control terminal coupled to a third node;
       a second transistor coupled between a fourth node and the second node and having a control terminal coupled to the third node;
       a third transistor coupled between a fifth node and the third node and having a control terminal coupled to the fourth node; and
       a first resistor coupled between the third node and the second node;
    a second input stage comprising:
       a fourth transistor coupled between a sixth node and the second node and having a control terminal coupled to a seventh node;
       a fifth transistor coupled between an eighth node and the second node and having a control terminal coupled to the seventh node;
       a sixth transistor coupled between a ninth node and the seventh node and having a control terminal coupled to the eighth node; and
       a second resistor coupled between the seventh node and the second node;
    an output stage comprising:
       a seventh transistor coupled between the first node and a tenth node and having a control terminal coupled to an eleventh node; and
       an eighth transistor coupled between the sixth node and a twelfth node and having a control terminal coupled to the eleventh node;

a ninth transistor coupled between the fourth node and a thirteenth node and having a control terminal;

a tenth transistor coupled between the eighth node and the thirteenth node and having a control terminal;

a third resistor coupled between the fourth node and a fourteenth node; and a fourth resistor coupled between the eighth node and the fourteenth node.

12. The driver circuit of claim 11 further comprising:

a first current source coupled to the thirteenth node; and a second current source coupled to the fourteenth node.

13. The driver circuit of claim 11 wherein the second node is coupled to a ground.

14. The driver circuit of claim 13 wherein the fifth node, the ninth node, the tenth node, the eleventh node, and the twelfth node are coupled to a reference voltage.

15. A driver circuit, comprising:

a first input stage comprising:

a first transistor coupled between a first node and a second node and having a control terminal coupled to a third node;

a second transistor coupled between a fourth node and the second node and having a control terminal coupled to the third node;

a third transistor coupled between a fifth node and the third node and having a control terminal coupled to the fourth node; and a first resistor coupled between the third node and the second node;

a second input stage comprising:

a fourth transistor coupled between a sixth node and the second node and having a control terminal coupled to a seventh node;

a fifth transistor coupled between an eighth node and the second node and having a control terminal coupled to the seventh node;

a sixth transistor coupled between a ninth node and the seventh node and having a control terminal coupled to the eighth node; and a second resistor coupled between the seventh node and the second node;

an output stage comprising:

a seventh transistor coupled between the first node and a tenth node and having a control terminal coupled to an eleventh node; and an eighth transistor coupled between the sixth node and a twelfth node and having a control terminal coupled to the eleventh node;

a thirteenth node coupled to the fourth node and the eighth node; and a modulating current source coupled to the thirteenth node.

16. A modulator having a driver, the driver comprising:

a first input stage comprising:

a first transistor coupled between a first node and a second node and having a control terminal coupled to a third node;

a second transistor coupled between a fourth node and the second node and having a control terminal coupled to the third node;

a third transistor coupled between a fifth node and the third node and having a control terminal coupled to the fourth node; and a first resistor coupled between the third node and the second node;

a second input stage comprising:

a fourth transistor coupled between a sixth node and the second node and having a control terminal coupled to a seventh node;

a fifth transistor coupled between an eighth node and the second node and having a control terminal coupled to the seventh node;

a sixth transistor coupled between a ninth node and the seventh node and having a control terminal coupled to the eighth node; and a second resistor coupled between the seventh node and the second node; and an output stage comprising:

a seventh transistor coupled between the first node and a tenth node and having a control terminal coupled to an eleventh node; and an eighth transistor coupled between the sixth node and a twelfth node and having a control terminal coupled to the eleventh node.

* * * * *